(12) United States Patent
Toh

(10) Patent No.: US 7,949,361 B2
(45) Date of Patent: May 24, 2011

(54) TERMINAL UNIT WITH EASILY DETACHABLE PANEL

(75) Inventor: Tadmine Toh, Kawasaki (JP)

(73) Assignee: NEC Infrontia Corporation, Kanagawa (JP)

( * ) Notice: Subject to any disclaimer, the term of this patent is extended or adjusted under 35 U.S.C. 154(b) by 826 days.

(21) Appl. No.: 11/690,024

(22) Filed: Mar. 22, 2007

(65) Prior Publication Data

US 2007/0285877 A1      Dec. 13, 2007

(30) Foreign Application Priority Data

Mar. 28, 2006    (JP) .................... 2006-087075

(51) Int. Cl.
*H04M 1/00* (2006.01)
*H04B 1/38* (2006.01)

(52) U.S. Cl. .................. 455/550.1; 455/575.1; 455/90.3

(58) Field of Classification Search .............. 455/575.1, 455/575.8, 575.3, 90.3, 550.01, 344; 361/679.29, 361/809; 379/433.13
See application file for complete search history.

(56) References Cited

U.S. PATENT DOCUMENTS

| 5,905,550 A * | 5/1999 | Ohgami et al. ............... 349/58 |
| 2006/0050867 A1 * | 3/2006 | Kawamoto ............... 379/433.13 |

FOREIGN PATENT DOCUMENTS

| JP | 1-149691 U | 10/1989 |
| JP | U-H05-48387 | 6/1993 |
| JP | 2003-346587 A | 12/2003 |

* cited by examiner

*Primary Examiner* — Tilahun Gesesse (74) *Attorney, Agent, or Firm* — Sughrue Mion, PLLC (57) ABSTRACT

In a terminal unit including a main body and a flexible panel coupled to a main body, the main body including a first engaging section having a guide rim. The flexible panel is mounted to the main body by using the first engaging section. The panel includes a first claw which is engaged with the first engaging section. The first claw has a guide face which extends to slantingly intersect the guide rim of the first engaging section.

13 Claims, 7 Drawing Sheets

TERMINAL UNIT WITH EASILY DETACHABLE PANEL

This application claims priority to prior application JP 2006-87075, the disclosure of which is incorporated herein by reference.

BACKGROUND OF THE INVENTION

The present invention relates to terminal units, and in particular, to a terminal unit having a detachable panel.

Recent telephones have a tendency to be designed for deluxe appearance such that the substantially entire front or upper surface is covered with a panel. Thus, an area in which the panel is fixed to the main body is limited. Accordingly, the short side of the panel is often attached to the main body. Therefore, strong force is needed to curve the panel, making it difficult to attach or detach the panel to/from the main body. Accordingly, it is necessary to finely adjust the length of the claw (the amount of projection from the side of the rectangular panel) so as to facilitate attachment and detachment of the panel to/from the main body, thus making it difficult to manufacture a die therefor.

Figures 1A, 1B:
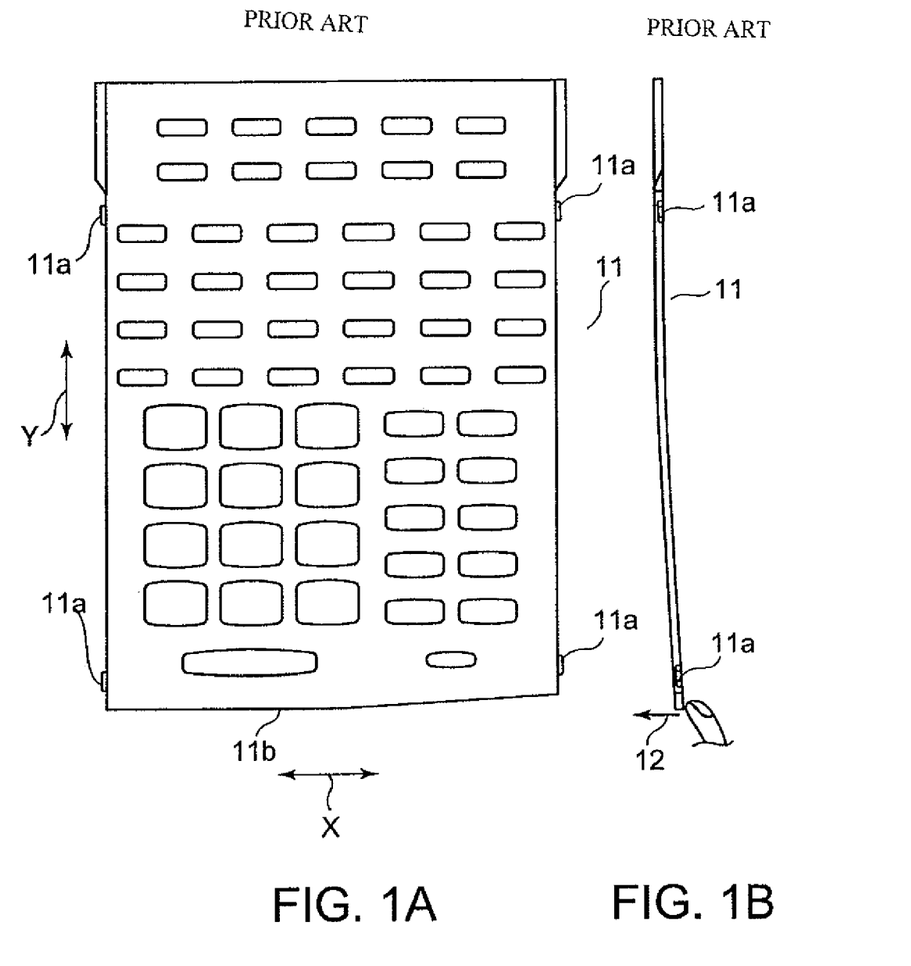
FIG. 1A is a plan view of a panel of a known telephone.
FIG. 1B is a side view of the panel in FIG. 1A.
Figure 2A:
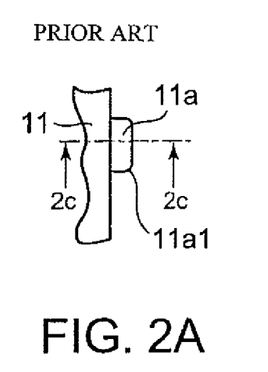
FIG. 2A is an enlarged diagram of essential parts of the panel in FIG. 1A.
Figure 2B:
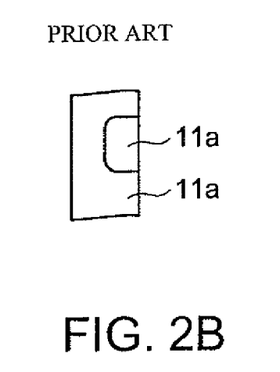
FIG. 2B is a side view of the panel in FIG. 2A.
Figure 2C:
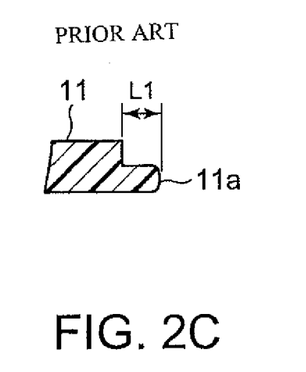
FIG. 2C is an enlarged sectional view of the panel taken along line 2c-2c of FIG. 2A.

Referring to FIGS. 1A to 2C, description will be made as regards a telephone including a detachable panel as a first related art. FIG. 1A is a plan view of a panel, denoted at 11. FIG. 1B is a side view of the panel 11. FIG. 2A is an enlarged diagram of essential parts of the panel 11. FIG. 2B is a side view of the panel 11 in FIG. 2A. FIG. 2C is an enlarged sectional view of the panel 11 taken along line 2c-2c of FIG. 2A.

The panel 11 is of a rectangular shape, and has a plurality of claws 11a on each of opposite sides in the lateral direction X, that is, opposite sides extending in the longitudinal direction Y. The claws 11a are fitted in the engaging holes in the telephone main body while the panel 11 is curved about the axis in the longitudinal direction Y. Thus the panel 11 is attached to the the longitudinal direction Y. Thus the panel 11 is attached to the telephone main body.

SUMMARY OF THE INVENTION

However, it is difficult to curve the rectangular panel 11 about the axis in longitudinal direction Y in comparison with about the axis in the lateral direction X. Accordingly, it is difficult to detach the panel 11 from the telephone main body. When a central portion 11b of the lower side of the panel 11 is pushed up as indicated by the arrow 12 with a finger to detach the panel 11 by force, the telephone main body or the claws 11a could be damaged.

Furthermore, it is also difficult to attach the panel 11 to the telephone main body. For example, it is necessary for ordinary telephones to adjust the length L1 of the claws 11a by 0.05 mm. This makes it difficult to manufacture the die for the panel 11.

Figure 3A:
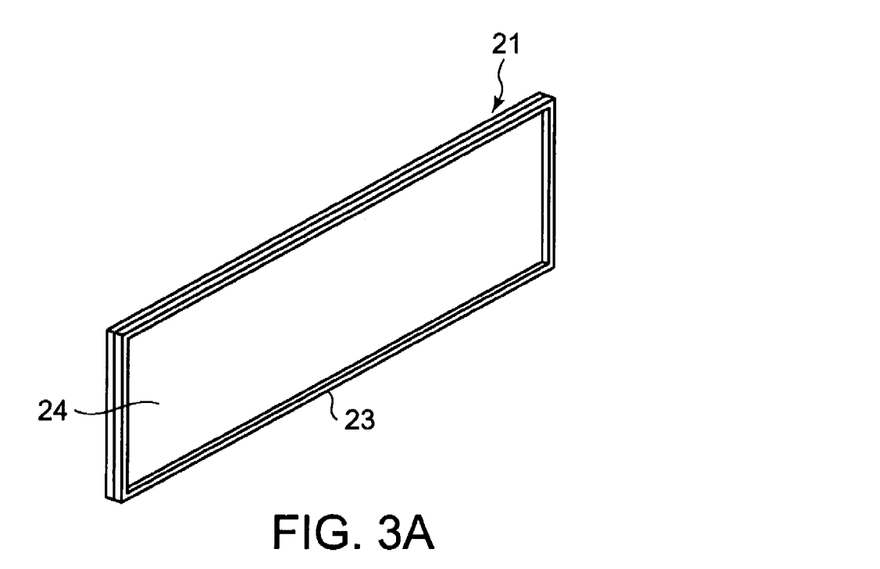
FIG. 3A is a perspective view of an another known panel main body.
Figure 3B:
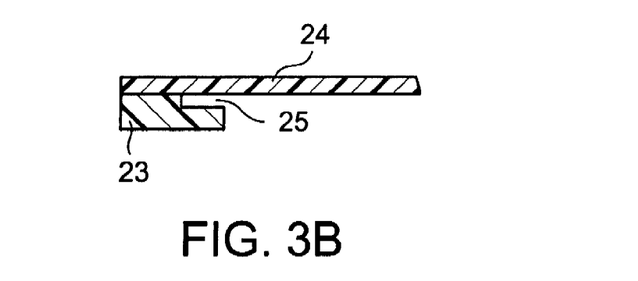
FIG. 3B is a sectional view of only essential parts of the panel main body of FIG. 3A.
Figure 4:
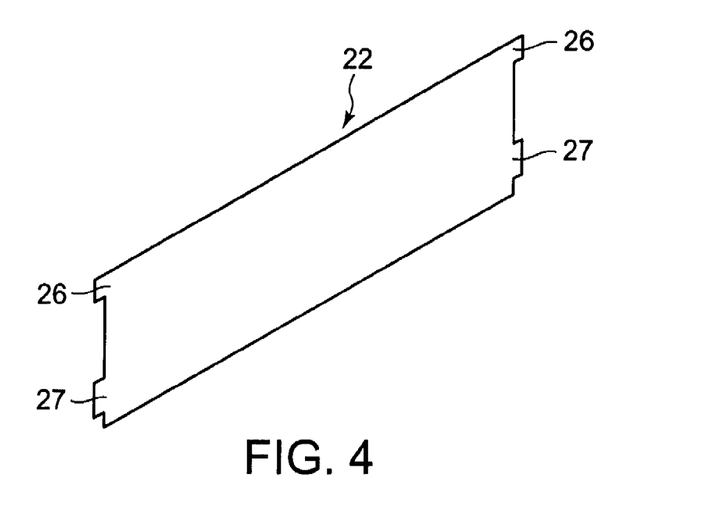
FIG. 4 is a perspective view of a panel mounted to the panel main body shown in FIGS. 3A and 3B.

Referring here to FIGS. 3A to 5D, the description will be made as regards a second related art (e.g., refer to Japanese Unexamined Utility Model Registration Application Publication No. 1-149691) merely for reference. In the second related art, a panel 22 is attached to or detached from a panel main body 21. FIG. 3A is a perspective view of the panel main body 21. FIG. 3B is a sectional view of only essential parts of the panel main body 21 of FIG. 3A. FIG. 4 is a perspective view of the panel 22. FIGS. 5A to 5D are diagrams for illustrating the procedure of attaching the panel 22 to the panel main body 21.

As shown in FIG. 3A, the panel main body 21 includes a frame 23 and a back plate 24 fixed to the back of the frame 23. As shown in FIG. 3B, the inside end rim on the back of the frame 23 has an attachment groove 25.

As shown in FIG. 4, the panel 22 has two claws 26 projecting at the upper part of the opposite sides of a flexible plastic plate, and two claws 27 projecting at the lower part.

The panel main body 21 and the panel 22 are combined together by the following work.

Figure 5A:
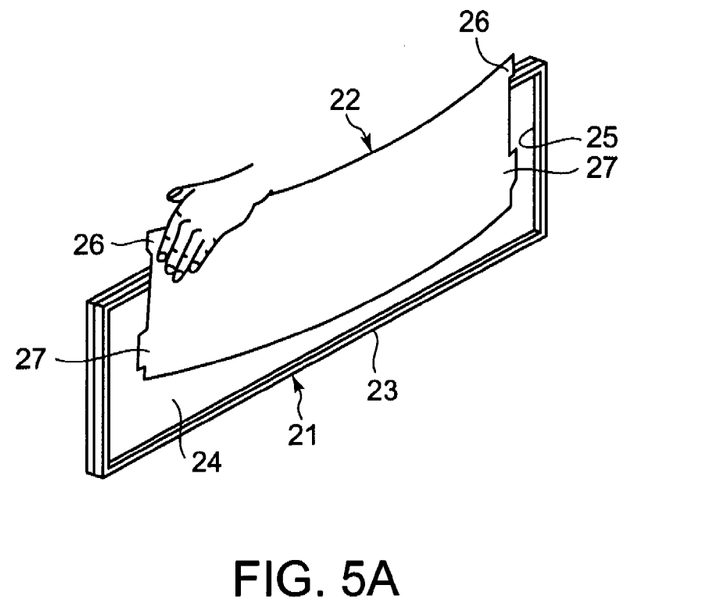
FIGS. 5A to 5D are diagrams for illustrating the procedure for attaching the panel of FIG. 4 to the panel main body shown in FIGS. 3A and 3B.

First, as shown in FIG. 5A, the claws 27 are inserted into the lower part of the attachment groove 25 on the opposite sides while the panel 22 is curved.

Figure 5B:
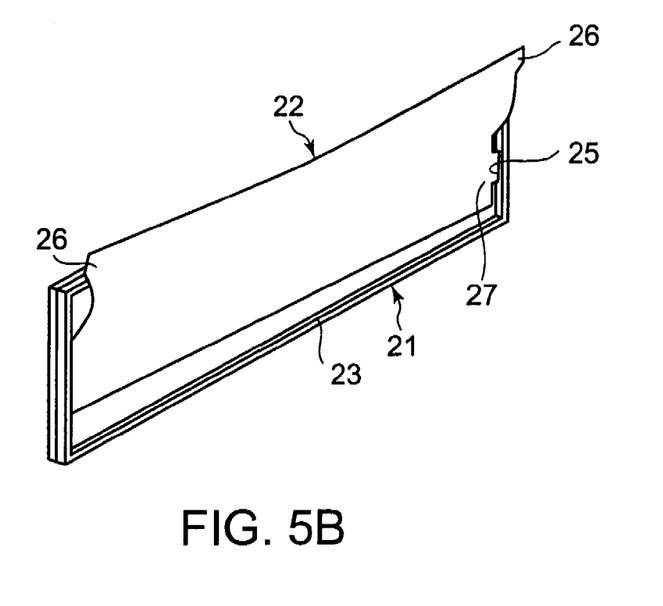

Next, referring to FIG. 5B, the panel 22 is fitted into the lower part of the attachment groove 25 on the opposite sides while the lower part of the panel 22 is extended.

Figure 5C:
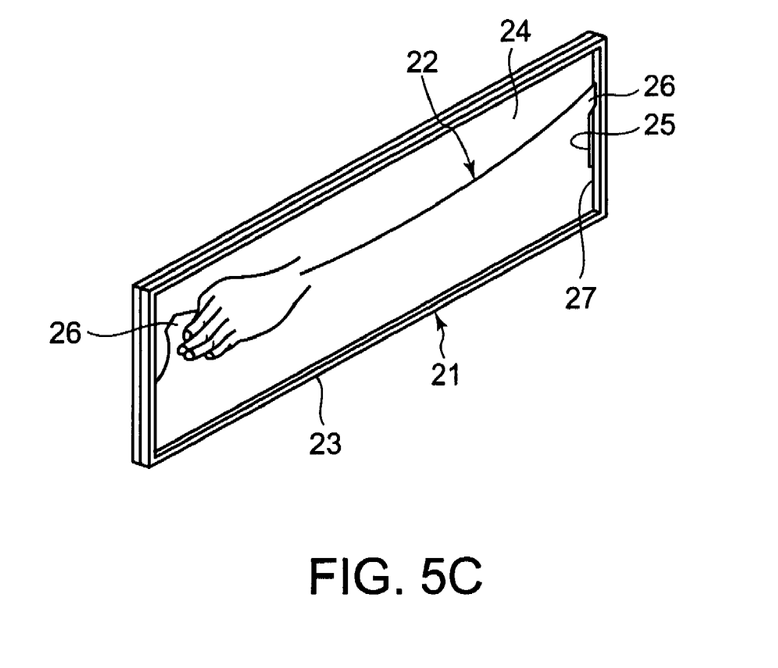

Then, as shown in FIG. 5C, the claws 26 are inserted into the upper part of the attachment groove 25 on the opposite sides while the upper part of the panel 22 is curved.

Figure 5D:
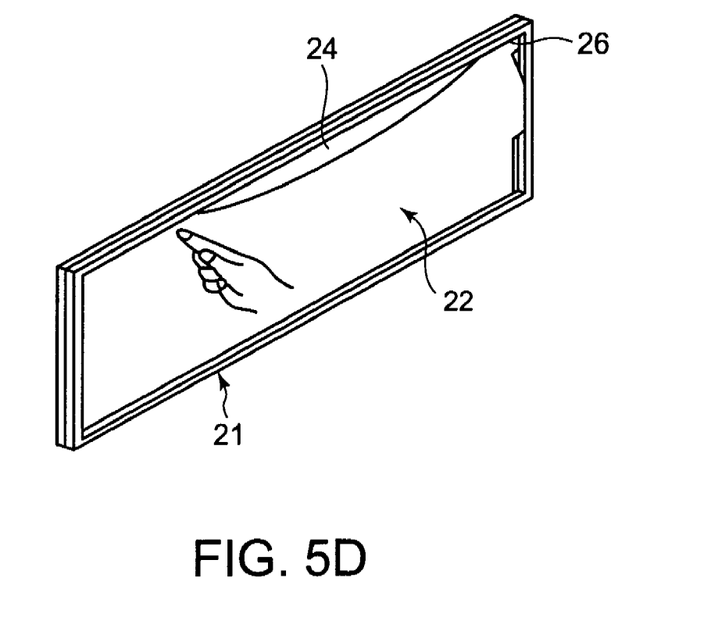

Finally, as shown in FIG. 5D, the panel 22 is fitted into the opposite upper parts of the attachment groove 25 while the upper part of the panel 22 is extended, thereby completing the assembly.

Figure 6:
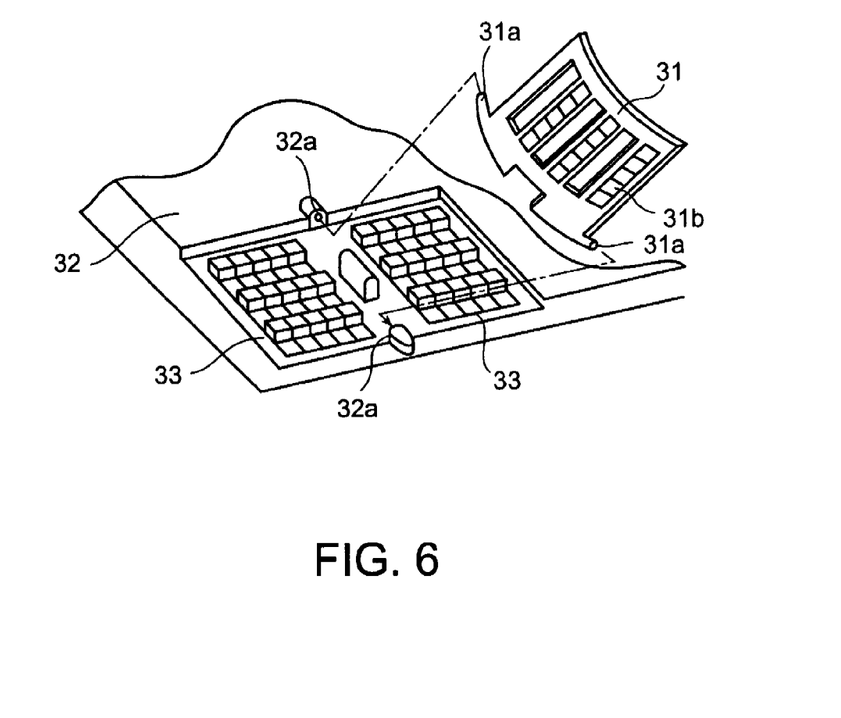
FIG. 6 is a perspective view of an operation-panel main body before a switching plate is attached thereto.

Referring to FIG. 6, the description will be directed to a structure according to a third related art (e.g., refer to Japanese Unexamined Patent Application Publication No. 2003-346587) merely for reference. In the third related art, a switching plate 31 is attached to or detached from an operation-panel main body 32. FIG. 6 is a perspective view of the operation-panel main body 32 before the switching plate 31 is attached thereto.

Shafts 31a project from opposite corners of one side of the switching plate 31. The surface of the switching plate 31 is fixed with a label 31b.

Two sets of one-touch keys 33 are mounted in the recess at one corner of the operation-panel main body 32. A pair of bearing projections 32a is provided in the center of the one-touch keys 33 on the operation-panel main body 32.

The switching plate 31 can be curved as illustrated, because it has flexibility. Thus, the shafts 31a of the switching plate 31 can be brought into or out of engagement with the bearing projections 32a, so that the switching plate 31 can be attached to or detached from the operation-panel main body 32.

After reviewing the second and the third related arts as mentioned above, the inventor was studied such a terminal unit and found structure making a panel be easily detachable from a main body of the terminal unit.

It is therefore an object of the present invention to provide a terminal unit including an easily detachable panel.

It is another object of the invention to provide a terminal unit including a panel that can easily be manufactured.

Other objects of the invention will become clear as the description proceeds.

According to an aspect of the present invention, there is provided a terminal unit which comprises a main body including a first engaging section having a guide rim and a flexible panel mounted to the main body by using the first engaging section, wherein the panel includes a first claw which is engaged with the first engaging section and wherein the first claw has a guide face which extends to slantingly intersect the guide rim of the first engaging section.

DESCRIPTION OF THE PREFERRED EMBODIMENTS

Referring to FIGS. 7 to 10C, a telephone which is an example of a terminal unit according to an embodiment of the invention will be described.

Figure 7:
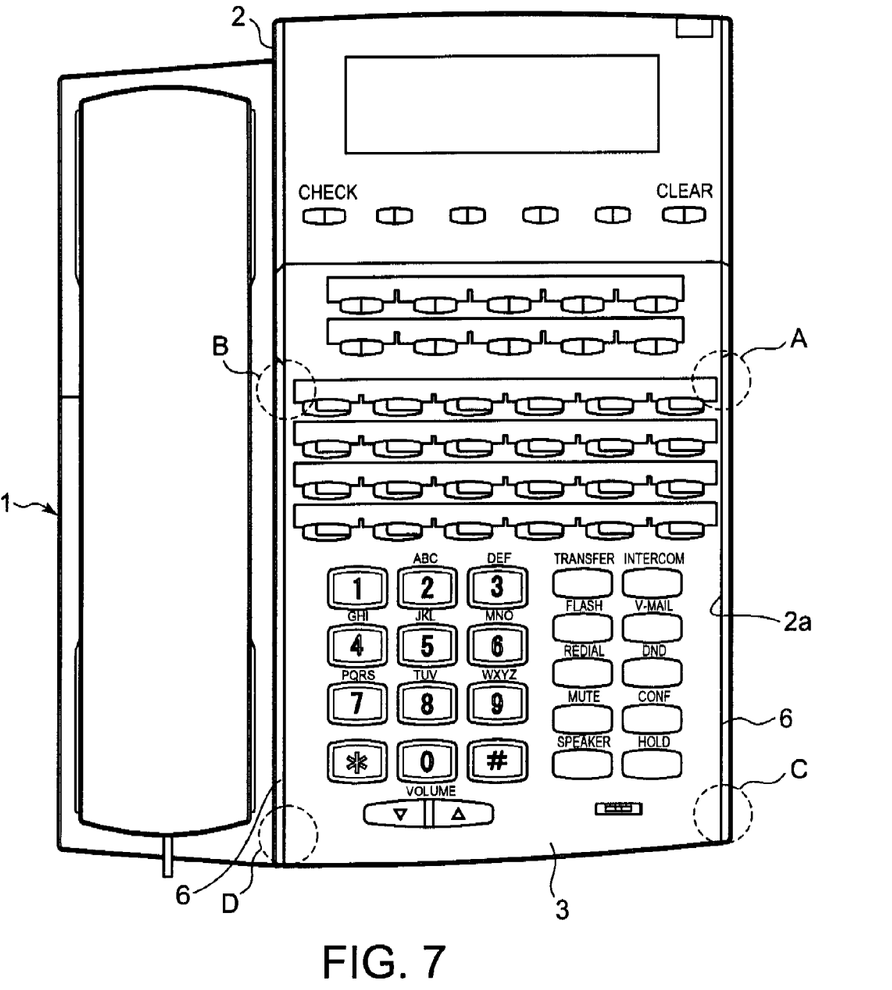
FIG. 7 is a plan view of a telephone as an example of a terminal unit according to an embodiment of the invention.
Figure 10A:
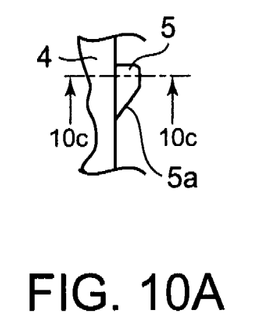
FIG. 10A is an enlarged diagram of essential parts of the panel in FIG. 9A.
Figure 10B:
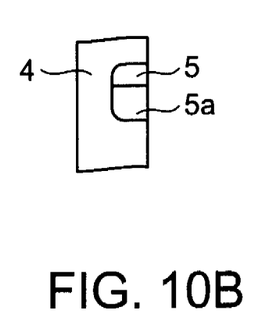
FIG. 10B is a side view of FIG. 10A.
Figure 10C:
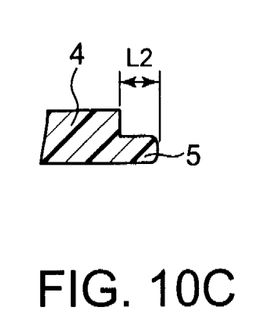
FIG. 10C is an enlarged sectional view taken along line 10c-10c of FIG. 10A.

The telephone, denoted by reference numeral 1, includes a unit main body 2 and a panel 3 attached to an attachment region 2a which accounts for almost all the upper surface of the unit main body 2. The panel 3 includes a substantially rectangular panel main body 4 made of flexible synthetic resin and four claws 5 formed on the side rims extending along the length (a first direction Y) of the panel main body 4, two claws per side, apart from each other in the first direction Y. As shown in FIG. 10A, the claws 5 each have a substantially trapezoidal shape in which one corner of a rectangular prism is diagonally cut off. The cut face forms into an inclined guide face 5a. As will be described later, the length L2 of the claw 5, shown in FIG. 10C, can be adjusted more easily than conventional one.

The unit main body 2 has two walls 6 on the upper surface, the walls 6 extending in the first direction Y apart from each other. The attachment region 2a is formed between the walls 6. The walls 6 each have two engaging holes 7. The engaging holes 7 are opposed in a second direction (the lateral direction of the panel main body 4) X perpendicular to the first direction Y The engaging holes 7 define engaging sections 6a for retaining the claws 5 of the panel 3. The rim of the engaging section 6a is referred to as a guide rim 6b.

The guide rim 6b extends in the first direction Y. The guide face 5a extends in the direction intersecting the first direction Y and the second direction X. Accordingly, when the panel 3 is attached to the main body 2, so that the claws 5 are fitted in the engaging holes 7 as shown in FIG. 7, the guide faces 5a of the claws 5 intersect slantingly to the guide rims 6b of the engaging sections 6a as shown in FIG. 8A.

Figure 8A:
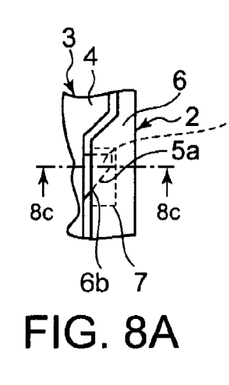
FIG. 8A is an enlarged view of portion A of the telephone in FIG. 7.
Figure 8B:
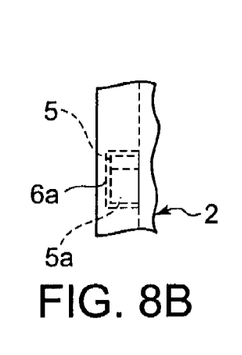
FIG. 8B is a side view of FIG. 8A.
Figure 8C:
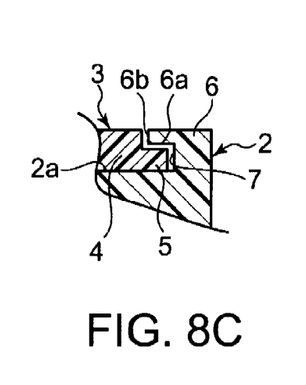
FIG. 8C is an enlarged sectional view taken along line 8c-8c of FIG. 8A.
Figures 9A, 9B:
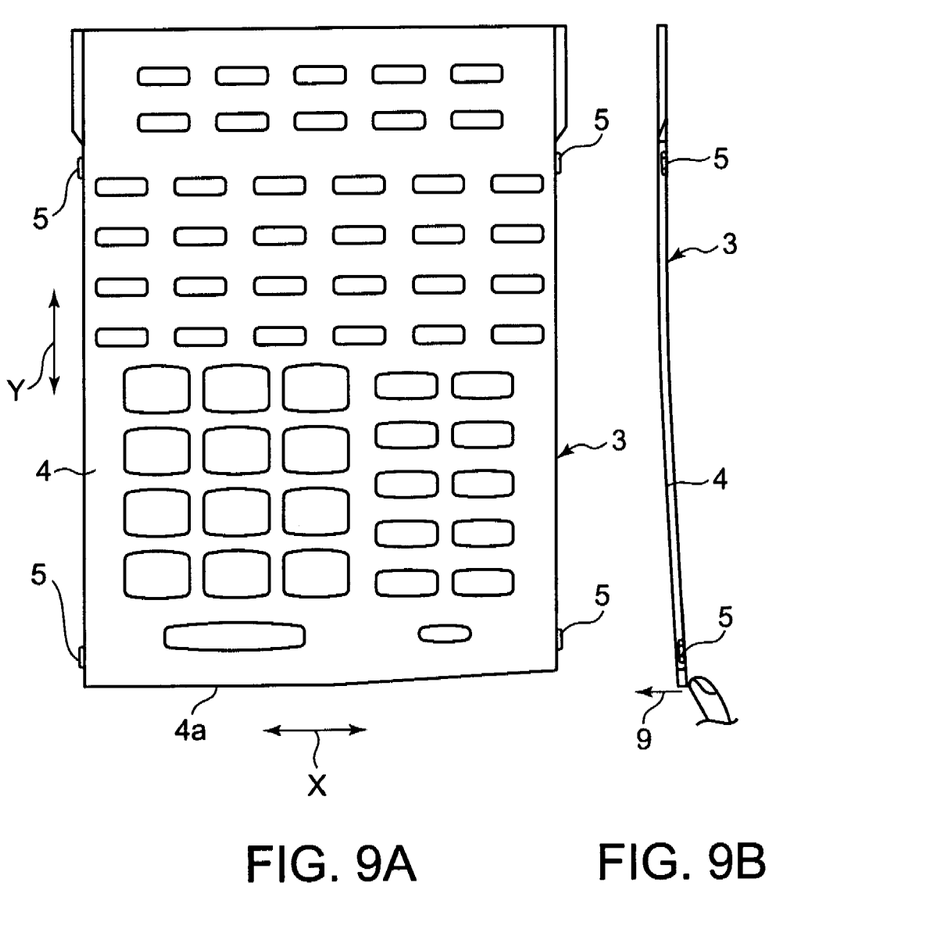
FIG. 9A is a plan view of the panel of the telephone in FIG. 7.
FIG. 9B is a side view of the panel in FIG. 9A.

The structure shown in FIGS. 8A to 8C is provided not only at portion A of FIG. 7, but also at portions B, C, and D. Here, the claw and the engaging section of portion A are referred to as a first claw and a first engaging section, respectively. The claw and the engaging section of portion B are referred to as a second claw and a second engaging section, respectively. The claws and the engaging sections of portions C and D are referred to as additional claws and additional engaging sections, respectively. The respective guide faces of the first and second claws are inclined in opposite directions. The respective guide faces of the first and second claws and the guide faces of the additional claws are inclined in the same direction.

In the state of FIG. 7 in which the panel 3 is mounted to the unit main body 2, the panel 3 is detached from the unit main body 2 as follows. A center portion 4a of the lower side of the panel main body 4 is pushed up with a finger as indicated by arrow 9 in FIG. 9B. Then, only the center of the panel 4 is raised. As a result, the panel 3 is easily curved. At that time, the claws 5 separate smoothly from the engaging holes 7 because the guide faces 5a of the claws 5 are guided by the guide rims 6b of the engaging sections 6a without getting caught. Thus, the panel 3 can be easily detached from the unit main body 2.

To mount (attach) the panel 3 to the unit main body 2, the lower side of the panel main body 4 is first inserted between the walls 6 of the unit main body 2. Thus, the claws 5 smoothly come into engagement with the engaging holes 7, because the guide faces 5a of the claws 5 are guided by the guide rims 6b of the engaging sections 6a without getting caught. Thus, the panel 3 can be easily attached to the unit main body 2.

While the present invention has thus far been described in connection with a single embodiment thereof, it will readily be possible for those skilled in the art to put this invention into practice in various other manners. For example, while the panel 3 is substantially rectangular, it may be in another shape (e.g., like a shape which is defined by a combination of tow parallel lines and two semicircular lines connected between ends of the parallel lines). While both the engaging holes 7 and the claws 5 are provided at opposite ends of the panel main body 4 in the second direction X, they may be provided at the opposite ends in the first direction Y. Furthermore, while the engaging holes 7 and the claws 5 are each provided in two positions of the opposite ends of the panel main body 4 in the second direction X, they may be provided in one or three or more positions. The invention has been described with a telephone as an example. The invention can also be similarly embodied in other terminal units.

What is claimed is:

1. A terminal unit comprising:
   a main body including a first engaging section having a guide rim; and
   a flexible panel mounted to the main body by using the first engaging section;
   wherein the panel includes a first claw which is engaged with the first engaging section; and
   wherein the first claw has a guide face which extends to slantingly intersect the guide rim of the first engaging section.

2. The terminal unit according to claim 1, wherein:
   the main body has an engaging hole that defines the first engaging section; and
   the first claw is fitted in the engaging hole.

3. The terminal unit according to claim 1, wherein:
the main body has an attachment region on which the panel is to be mounted; and
the first engaging section is disposed adjacent to the attachment region.

4. The terminal unit according to claim 3, wherein:
the main body comprises a first wall and a second wall apart from the first wall;
the mount region is defined between the first and second walls; and
the first engaging section is formed at the first wall.

5. The terminal unit according to claim 4, wherein:
the main body includes a second engaging section which is formed at the second wall and has a guide rim;
the panel includes a second claw engaged with the second engaging section; and
the second claw has a guide face which extends to intersect the guide rim of the second engaging section.

6. The terminal unit according to claim 5, wherein the guide face of the first claw and the guide face of the second claw extend in directions, respectively, which intersect to each other.

7. The terminal unit according to claim 4, wherein:
the main body includes an additional engaging section which is formed at the first wall and has a guide rim;
the panel includes an additional claw which is engaged with the additional engaging section; and
the additional claw has a guide face which extends to slantingly intersect the guide rim of the additional engaging section.

8. The terminal unit according to claim 7, wherein the guide face of the first claw and the guide face of the second claw extend in directions, respectively, which are parallel to each other.

9. The terminal unit according to claim 1, wherein:
the panel has a rectangular panel main body; and
the first claw is joined with a long side of the panel main body.

10. The terminal unit according to claim 9, wherein:
the long side of the panel main body extends in the first direction;
the guide rim extends in the first direction and is opposed to the long side of the panel main body in a second direction which is perpendicular to the first direction; and
the guide face extends in a direction which is slant to the first and the second directions.

11. The terminal unit according to claim 1, wherein the first claw is substantially trapezoidal.

12. The terminal unit according to claim 1, wherein the panel and the first claw form a flat planar surface.

13. The terminal unit according to claim 1, wherein the panel detachably engages the first engaging section on the main body by means of the first claw.

* * * * *

UNITED STATES PATENT AND TRADEMARK OFFICE
CERTIFICATE OF CORRECTION

| | | |
|---|---|---|
| PATENT NO. | : 7,949,361 B2 | Page 1 of 1 |
| APPLICATION NO. | : 11/690024 | |
| DATED | : May 24, 2011 | |
| INVENTOR(S) | : Tadamine Toh | |

It is certified that error appears in the above-identified patent and that said Letters Patent is hereby corrected as shown below:

Title page item [75] (Inventor), Line 1: Delete "Tadmine" and insert -- Tadamine --, therefor.

Column 1, Line 5: After "JP 2006-87075," insert -- filed Mar 28, 2006, --.

Column 1, Line 39: After "to" delete "the".

Column 3, Line 60: Delete "Y" and insert -- Y. --, therefor.

Column 4, Line 40: Delete "tow" and insert -- two --, therefor.

Signed and Sealed this
Fourteenth Day of August, 2012

David J. Kappos
*Director of the United States Patent and Trademark Office*